United States Patent [19]

Stetter et al.

[11] Patent Number: 4,682,108

[45] Date of Patent: Jul. 21, 1987

[54] MAGNETIC RESONANCE EQUIPMENT FOR THE PRODUCTION OF IMAGES OF A TEST OBJECT

[75] Inventors: Eckart Stetter, Erlangen; Helmut Reichenberger, Eckental; Siegfried Schneider, Erlangen; Axel Wirth, Nuremberg, all of Fed. Rep. of Germany

[73] Assignee: Siemens Aktiengesellschaft, Berlin and Munich, Fed. Rep. of Germany

[21] Appl. No.: 759,535

[22] Filed: Jul. 26, 1985

[30] Foreign Application Priority Data

Aug. 1, 1984 [DE] Fed. Rep. of Germany ....... 3428391

[51] Int. Cl.$^4$ ........................................... G01R 33/20
[52] U.S. Cl. .................................... 324/309; 128/653
[58] Field of Search ............... 324/309, 307, 313, 306, 324/314, 300, 312; 128/653

[56] References Cited

U.S. PATENT DOCUMENTS

| | | | |
|---|---|---|---|
| 4,409,550 | 10/1983 | Fossel et al. | 324/300 |
| 4,486,708 | 12/1984 | Macovski | 324/309 |
| 4,545,384 | 10/1985 | Kawachi | 128/653 |
| 4,549,140 | 10/1985 | MacFall | 324/309 |
| 4,564,017 | 1/1986 | Glover | 128/653 |
| 4,567,893 | 2/1986 | Charles et al. | 128/653 |
| 4,573,014 | 2/1986 | Riederer | 324/307 |
| 4,577,152 | 3/1986 | Macovski | 324/309 |
| 4,599,565 | 7/1986 | Hoenninger, III et al. | 324/309 |

FOREIGN PATENT DOCUMENTS 0093897 4/1983 European Pat. Off. .
0096487 5/1983 European Pat. Off. .
2854774 12/1978 Fed. Rep. of Germany .

OTHER PUBLICATIONS

Scientific American Publication, dated May 1982, vol. 246, No. 5, pp. 54–64.
W. S. Hinshaw et al., The Fundamentals of Magnetic Resonance Imaging, Technicare Corp., 1984, pp. 53–56.

Primary Examiner—Stewart J. Levy
Assistant Examiner—Scott M. Oldham
Attorney, Agent, or Firm—Lawrence C. Edelman

[57] ABSTRACT

The disclosure relates to nuclear spin tomography equipment in which means (22, 24) are provided for the control of the acquisition of the Fourier rows of the measurement matrix as a function of a respiration signal. The equipment includes a Fourier row counter (25) which influences a circuit (26) that controls the measurement signal acquisition. In a first embodiment of the invention the measurement signal acquisition is always released for all rows outside a predetermined region, but is a function of the respiration phase signal inside this region. The predetermined row region may comprise approximately 10% of all rows to be measured and should lie symmetrically about the center of the matrix. A further reduction of the measuring time is realized, according to another embodiment of the invention, by dispensing altogether with measurement in the row edge region of the matrix.

10 Claims, 7 Drawing Figures

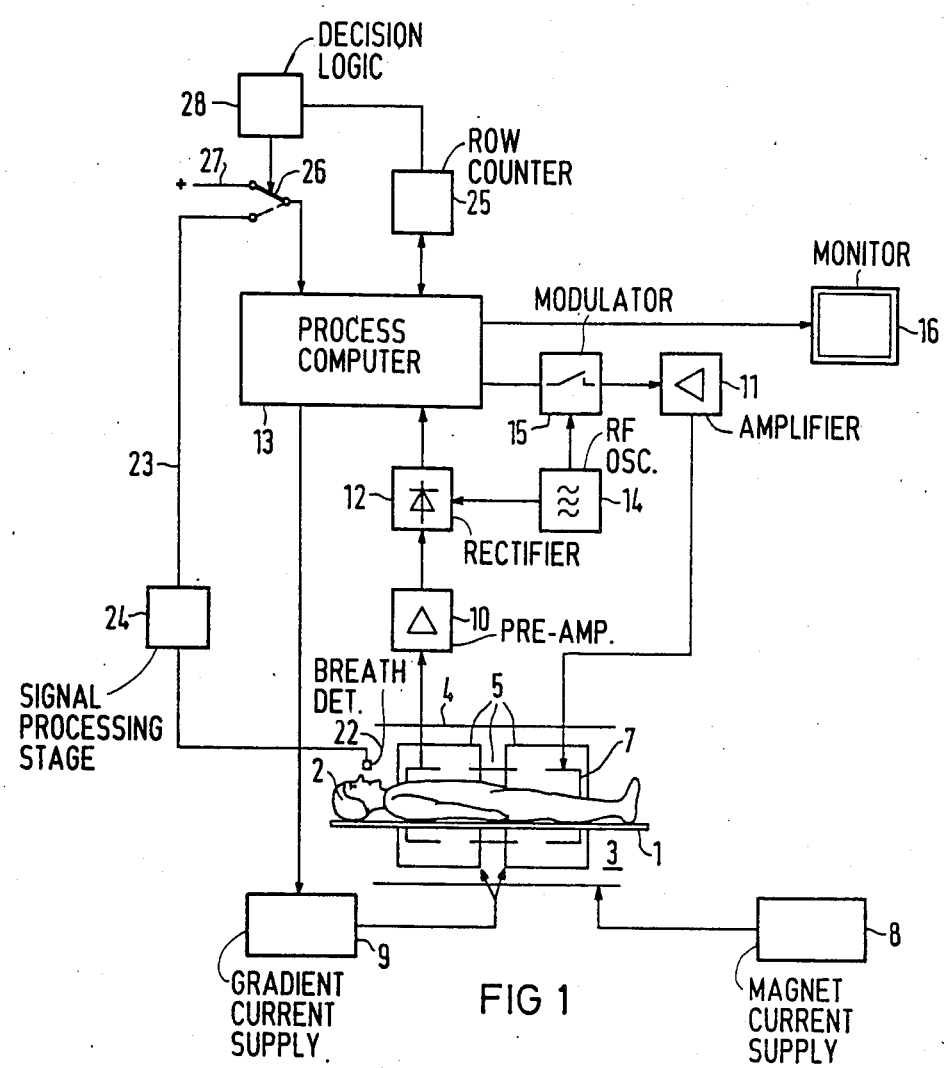

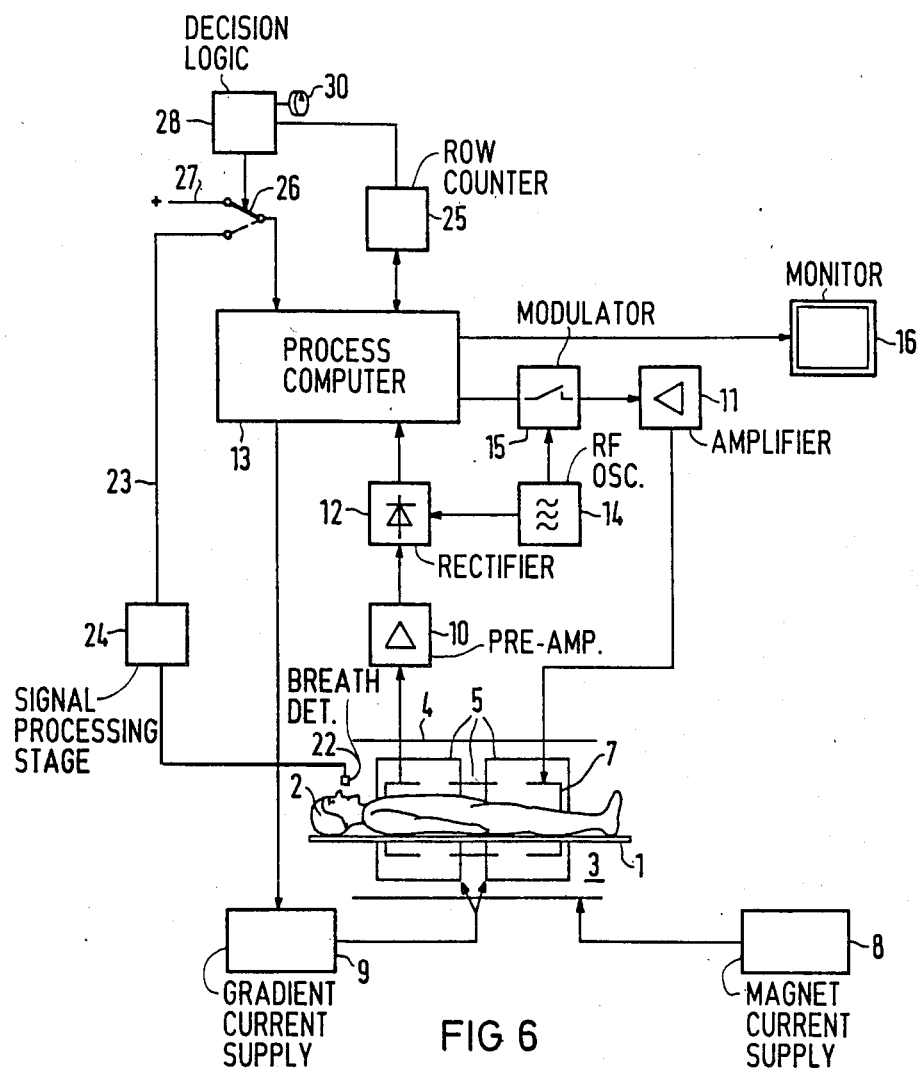

MAGNETIC RESONANCE EQUIPMENT FOR THE PRODUCTION OF IMAGES OF A TEST OBJECT

BACKGROUND OF THE INVENTION

The invention relates to an equipment for the production of images of a test object using nuclear magnetic resonance. Such equipment includes means for applying magnetic primary and gradient fields to the test object and for picking up the deflection of the nuclear spins of the test object from their equilibrium position caused by a radio-frequency magnetic excitation pulse. With a plurality of gradients in a cross-sectional "slice" of the test object, a projection of the nuclear spins on a frequency axis is picked up as a Fourier row and from the Fourier rows an image of the respective examined slice is calculated by Fourier transformation. The equipment also includes means for controlling the acquisition of the Fourier rows as a function of a "motion" signal representing the motion of an organ.

It is known that, in particular the hydrogen nuclear spins of a test object can be deflected away from a preferential direction, generated by a magnetic primary field, by a radio-frequency excitation pulse. After termination of this excitation pulse these spins swing back into the preferential direction only after a certain time. During this time the spins precess with a frequency which depends on the intensity of the magnetic primary field. This precession can be detected with an RF antenna and corresponding receiver circuits. By superimposing a first field gradient on this homogeneous magnetic primary field so that the magnetic field distribution varies spatially, it is possible to locate the spins in one spatial direction—namely, the gradient direction—over the respective measured frequency.

It is also known that, by brief application of a second field gradient of variable amplitude or duration, orthogonal to the first gradient, a location coding in a second spatial axis can be carried out before the signals in the first gradient are read out, thereby to create cross-sectional images of a test object. The excitation in a slice of the test object is brought about by the fact that the magnetic primary field is influenced by an additional third field gradient, normal to the first and second gradients, such that the excitation of the spins takes place only in this slice. This is possible because the excitation occurs only with a frequency which is strictly correlated to the magnetic field in the desired slice. This method is described for example in the German published Patent Application No. OS 2,611,497 (corresponding to U.S. Pat. No. 4,070,611).

Due to the multiplicity of necessary measuring processes, a complete measurement for a cross-sectional slice takes so long that organ movements in the test object, for example movements due to heartbeat or respiration, show up as interferences in the generated image. To avoid such interferences, it is a known practice to control the test value acquisition as a function of the EKG and/or the respective respiration phase of the patient. Under respiration phase control, the acquired measured value is released and utilized only in a relatively short time span of each respiration phase. However, since only a small percentage of the available information is utilized, this technique results in a considerable increase of the measurement time, which is not always acceptable in the practice.

SUMMARY OF THE INVENTION

It is the object of the present invention to provide equipment of the type described above which reduces movement artifacts in the image, produced by respiratory movements, to a minimum, while the measurement time is considerably reduced as compared with equipment known in the art.

In a first embodiment this object is achieved, according to the invention, by a row counter which actuates circuit means for controlling the measurement signal acquisition in such a way that the acquired measurement signal is always released for all rows outside a predetermined region, but is a function of the respiration phase or other organ movement signal within this region. In the equipment according to the invention, respiration-related movement artifacts are practically completely suppressed by suitable control of the measurement signal acquisition (i.e., so-called "breath gating") around the Fourier zero row, which is effected by the absence of the gradient coding the second space axis, and permanent release of the acquired measurement value in more remote rows.

In a second embodiment the aforementioned object is achieved, according to the invention, by a row counter which actuates circuit means for controlling the measurement signal acquisition in such a way that the acquired measurement signal is turned off for all rows outside a predetermined region and replaced by a synthetic value, and that the acquired measurement signal within this region is released as a function of the organ movement signal.

By this measure one saves the measuring time of those Fourier rows which, due to the region selection, lie outside the predetermined region. The unsharpness of the image caused by adoption of the measurement value "zero" is buried in the unsharpness caused in any case by organ movement, so that there is no quality reduction in the image region of the organ.

For a full understanding of the present invention, reference should now be made to the following detailed description of two preferred embodiments of the invention and to the accompanying drawings.

BRIEF DESCRIPTION OF THE DRAWINGS

FIG. 1 is a block diagram of nuclear magnetic resonance equipment according to a first preferred embodiment of the present invention.

FIG. 2 is a graph showing the spatial dependence of the nuclear resonance frequency in the apparatus of FIG. 1.

FIG. 6 is a block diagram of nuclear magnetic resonance apparatus according to a second preferred embodiment of the present invention.

DESCRIPTION OF THE PREFERRED EMBODIMENTS

Figure 3:
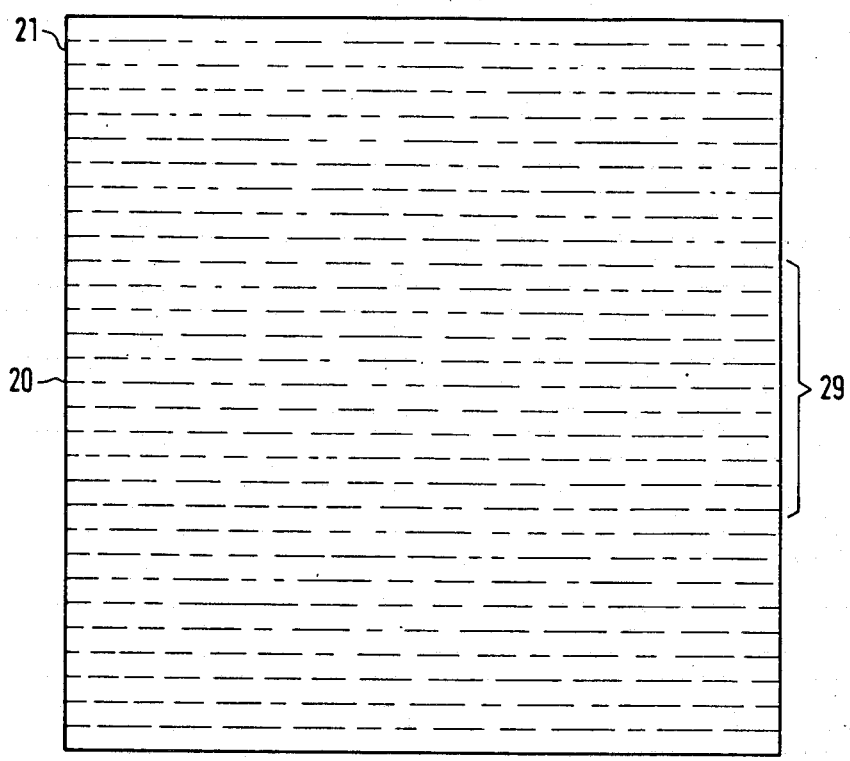
FIG. 3 is a diagram of a measuring matrix comprised of parallel "Fourier rows" which is calculated by the apparatus of FIG. 1.

Both FIGS. 1 and 6 show a table 1 upon which there lies a patient 2 of whom images are to be produced by means of nuclear magnetic resonance equipment. To this end, there is provided a coil system 3 comprising a coil 4 for the generation of a homogeneous magnetic primary field, as well as gradient coils 5 for varying this magnetic primary field, and an excitation and measuring coil 7. Coil 4 is connected to a magnet current supply 8; the gradient coils 5 are connected to a gradient current supply 9; and the excitation and measuring coil 7 is connected to a preamplifier 10 and, via corresponding coupling elements, to a transmitting amplifier 11. Preamplifier 10 supplies the test signal via a phase-sensitive rectifier 12 to a process computer 13 which controls the entire measuring process. A radio-frequency oscillator 14 is used for generation of the excitation pulses. This oscillator 14 is connectable to the transmitting amplifier 11 via a modulator 15. The images reconstructed from the test signals are reproduced on a monitor 16.

To produce the image of a cross-sectional slice of the patient 2 lying in the coil system 3, the spins in the desired slice are first excited.

FIG. 2 shows how the respective excited slice in patient 2 is determined by the location dependence of the flux density and hence of the nuclear resonance frequency. The field gradient for the primary field is represented schematically in FIG. 2 and designated by 17. The resonance frequency is indicated by f. There occurs only an excitation of the spins in the represented region of patient 2.

After the excitation there occurs the coding of the spins in the second space axis (as above) by applying a brief gradient in the second spatial direction, hereinafter called the "coding gradient". Thereafter, the nuclear resonance signal in the socalled "readout gradient", which defines the first spatial dimensions, is scanned. This process is repeated, for example, with a coding gradient varied from positive to negative, step by step. The nuclear resonance signals read out at a certain coding gradient amplitude are referred to as a "Fourier projection".

The measurement signals corresponding to the successive Fourier projections correspond to parallel Fourier rows of a measuring matrix, which is illustrated in FIG. 3. In practice, for example 256 Fourier rows may be provided in a complete measuring matrix, the Fourier zero row 20, which belongs to the coding gradient of amplitude 0, lying at the center of the measuring matrix 21 according to FIG. 3. By two-dimensional Fourier transformation by rows and columns, an image of the examined slice can be calculated from the measurement signals of the individual Fourier rows.

If the measurement signal acquisition occurs uninterruptedly, disturbing movement artifacts will be produced in the generated image. For this reason it is known practice to record the respiration curve of the patient 2, using a pickup or sensor, and to process the respiration signal by means of an electronic system in such a way that measurement signals are acquired only during a certain time interval of each respiration phase, while all other measurements occuring outside this interval are discarded. To minimize the movement unsharpness in the images, the time interval is made as short as possible. This, however, drastically lengthens the measuring time as compared with measurement signal acquisition not triggered by respiration.

For a matrix with 256 rows, at least 256 separate recordings must be made. In a respiratory phase-controlled measurement, the coding gradient can be stepped only in "release" state (i.e., when measurement signals are released and utilized), because all measurements not taken in the release state are discarded.

Now the first embodiment of the present invention is based on the discovery that a practically complete suppression of respiration-related movement artifacts in the generated image is possible also if breath-gating occurs only around the Fourier zero row, whereas in more remote Fourier rows the measurement signal is always acquired and used. As compared with the case of continuous measurement signal acquisition, the measuring time is thereby lengthened only insignificantly.

Figure 5:
FIG. 5 is a signal diagram showing a respiration control signal derived from the signal of FIG. 4.
Figure 4:
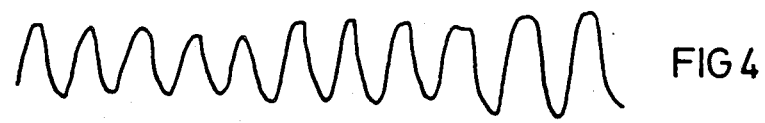
FIG. 4 is a signal diagram showing a typical respiration responsive signal produced by a breath sensor in the apparatus of FIG. 1.

For respiration phase-controlled measurement signal acquisition the patient 2 is provided with a breath detector 22, which causes a processing stage 24 to generate a respiration phase signal on line 23. This respiration phase signal takes the form shown in FIG. 4 for example. FIG. 5 shows that the respective maximum regions of the respiration curve per FIG. 4 may be used to generate a control signal for the intermittant release of acquired measurement values.

The respiration phase signal, however, does not always cause control of the measurement value acquisition per FIG. 5, but only when the Fourier rows lie within a certain first region around the zero row 20. This first region is designated by the reference number 29 in FIG. 3 and comprises ±ten rows, for example, this having been found in practice to be sufficient. For the Fourier rows 1 to 117, a row counter 25, actuated by the process computer 13, causes a switch 26 to receive a permanent release signal via a line 27, so that measurement values are acquired independently of the patient's respiration. After Fourier row 117 and before Fourier row 138, the switch 26 is changed by the row counter 25, via its decision logic 28, to its position shown in dashed lines, so that the measurement value acquisition for the 118th to 137th Fourier row is respiration phase-controlled. Thereafter, the measurement signal acquisition for the 138th to 256th Fourier row occurs continuously again; that is, independently of the respective respiration phase. The 128th Fourier row is the Fourier zero row.

Generally it is noted that switching to line 27—i.e., to the release state—takes place whenever the row counter 25 has a value between −N and −A, as well as between +A and +N, N being the total number of matrix rows and A being a prescribed row number. In the range −A...+A the release state varies according to the respiration cycle (FIG. 5). Since, as has been explained, in practice only a relatively small number (for instance 20 out of 256) of Fourier rows must be produced in a respiration phase-controlled manner, the measuring time is considerably shortened as compared with the respiration phase-controlled production of all Fourier rows. Yet an excellent artifact suppression is achieved.

The predetermined first row region 29 comprises, in the first embodiment, ±10% of all measured Fourier rows. This region may be fixed, or it may be preselectable according to the particular requirements of image quality.

The second embodiment of the invention is based on the reasoning that it is not expedient to represent as sharply as possible an unsharpness which exists anyway and which comes about through organ movement. Therefore, a corresponding unsharpness should be allowed also in the technical realm of image synthesis. This unsharpness, in turn, can be made use of to shorten the recording time.

Figure 7:
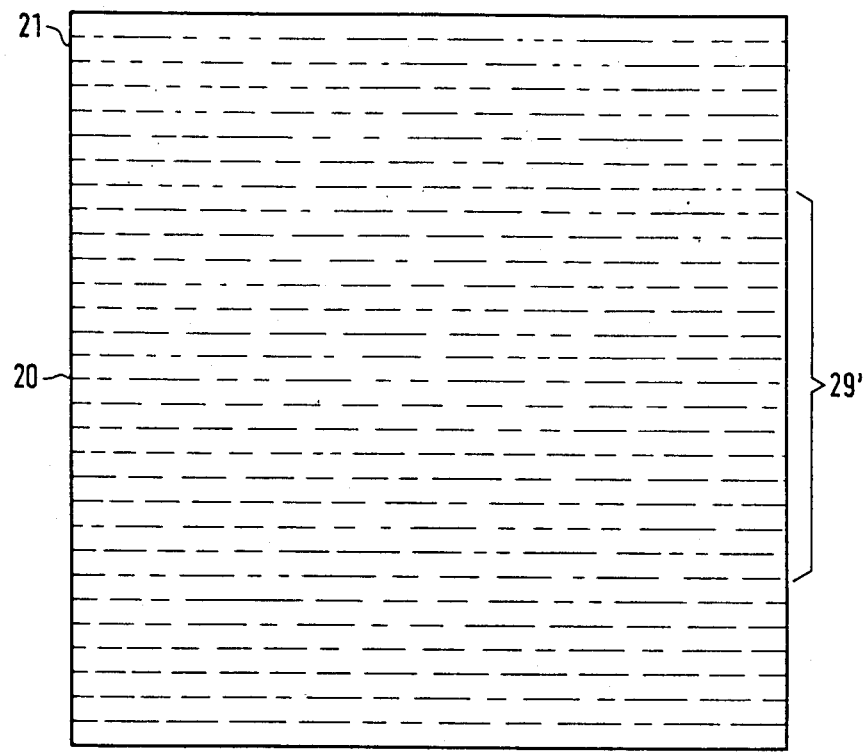
FIG. 7 is a diagram of a measuring matrix comprised of a plurality of Fourier rows which is developed by the apparatus of FIG. 6.

In FIG. 6, like parts bear the same reference symbols as in FIG. 1. There is shown a row counter 25 which is coupled via a connecting line with a decision logic 28. Depending upon the status of the row counter 25, a decision is made in logic 28 whether a switch 26 is switched to its position shown in a dashed line or to its position shown in a solid line. The decision logic 28 comprises a manually adjustable control element 30 by which a central region 29', as shown in FIG. 7, can be permanently selected. The logic 28 determines whether the row state of the row counter 25 lies inside this region 29'. If it is inside region 29', the switch 26 is moved into the dashed-line position, or, if it was already in that position, it is retained there. If the state of row counter 25 lies outside region 29', the switch 26 is analogously moved to its solid-line position or retained there.

In the position of the switch 26 indicated by a solid line, a control signal is fed to the process computer 13 via a line 27. In the presence of this control signal, the process computer 13 switches the image data acquisition off and introduces instead of a measured value a synthetic, preset value. This synthetic value may, for example, be white noise, a constant, or zero. If the switch 26 is in its dashed position, the process computer 13 receives a respiration phase signal via a processing stage 24. The respiration-controlled measurement value acquisition, described in connection with the preceding figures, then takes place.

The region 29' set by the control element 30 need not necessarily be identical with the region 29 as shown in FIG. 3 and described before. In this second embodiment it is expedient to select region 29' so that about 50% of all Fourier rows are included. Preferably they lie again in the center of the matrix, which means that, in the preferred example of about 50% and a matrix of 256 rows, only measured values or rows 64 to 192 are recorded. For rows 1 to 63 and 193 to 256, for example, zero may be entered as a synthetic value. This results in a measuring time saving of one half.

As laboratory tests have shown, this insertion of the synthetic value has no adverse consequences for the image quality in the region of moving organs. In the region of motionless objects such as the spinal column, for example, slight quality reductions may be accepted. This can be coped with in particular when these motionless objects are not the aim of the examination.

Further it has been found that, for a rough orientative record, it is possible to reduce the number of measured Fourier rows by as much as 75%. That is, only the Fourier rows 96 to 160 are measured; for the remaining Fourier rows the synthetic value, e.g., a constant, is entered.

An advantage of the equipment according to the invention is that the loss of time caused by the respiration controlled image data acquisition can be compensated without appreciable reduction of the image quality. It is conceivable also to use the equipment for images not triggered by respiration, in which case a considerable shortening of the measuring time can be obtained with little loss of image quality.

The described respiration phase-controlled measurement signal generation around the Fourier zero row may be combined with EKG triggering in the manner known in the art.

There has thus been shown and described novel magnetic resonance equipment which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. Apparatus for producing images of a test object using nuclear magnetic resonance, at least a portion said test object being subject to physical motion, said apparatus comprising:
   (a) first means for applying magnetic primary and gradient fields to the test object and for detecting deflection of nuclear spins of the test object from their equilibrium position by a radio-frequency magnetic excitation pulse, said first means producing a plurality of time-sequential measurement signals representative of said nuclear spin deflection in response to a respective plurality of excitation pulses time-sequentially applied with corresponding gradient fields;
   (b) second means, responsive to said produced measurement signals, for calculating an image of a cross-sectional slice of the test object by Fourier transformation from a matrix of Fourier rows, each Fourier row being calculated from at least one of said time-sequential measurement signals as a projection of the nuclear spins on a frequency axis caused by the plurality of magnetic field gradients in said slice;
   (c) third means for generating a motion signal representative of said physical motion of said portion of the test object;
   (d) fourth means, coupled to said second means, for counting Fourier rows; and
   (e) fifth means, responsive to said fourth means and coupled to said second and third means, for controlling the calculation of said image such that said time-sequential measurement signals are continuously produced for use by said second means for the calculation of Fourier rows outside a predetermined region of the rows in said matrix, but are intermittently produced for use by said second means as a function of said motion signal when within said region.

2. The apparatus defined in claim 1, wherein said predetermined row region is preselectable according to the requirements of image quality.

3. The apparatus defined in claim 1, wherein said predetermined row region comprises approximately 10% of all measured Fourier rows.

4. The apparatus defined in claim 2, wherein said predetermined row region lies approximately in the center of said matrix.

5. The apparatus defined in claim 3, wherein said predetermined row region lies approximately in the center of said matrix.

6. Apparatus for producing images of a test object using nuclear magnetic resonance, at least a portion said test object being subject to physical motion, said apparatus comprising:
  (a) first means for applying magnetic primary and gradient fields to the test object and for detecting deflection of nuclear spins of the test object from their equilibrium position by a radio-frequency magnetic excitation pulse, said first means producing a plurality of time-sequential measurement signals representative of said nuclear spin deflection in response to a respective plurality of excitation pulses time-sequentially applied with corresponding gradient fields;
  (b) second means, responsive to said produced measurement signals, for calculating an image of a cross-sectional slice of the test object by Fourier transformation from a matrix of Fourier rows, each Fourier row being calculated from at least one of said time-sequential measurement signals as a projection of the nuclear spins on a frequency axis caused by the plurality of magnetic field gradients in said slice;
  (c) third means for generating a motion signal representative of said physical motion of of the test object;
  (d) fourth means, coupled to said second means, for counting Fourier rows; and
  (e) fifth means, responsive to said fourth means and coupled to said second and third means for controlling the calculation of said image such that said Fourier rows which are outside a predetermined region of rows in said matrix are given a prescribed, synthetic value , but for Fourier rows within said region, selected ones of said measurement signals selected as a function of said motion signal are used by said second means for the calculation of said Fourier rows.

7. The apparatus defined in claim 6, wherein said predetermined row region is preselectable according to the requirements of image quality.

8. The apparatus defined in claim 6, wherein said predetermined row region comprises approximately 50% of all measured Fourier rows.

9. The apparatus defined in claim 7, wherein said predetermined row region lies approximately in the center of said matrix.

10. The apparatus defined in claim 8, wherein said predetermined row region lies approximately in the center of said matrix.

* * * * *